United States Patent [19]

Toyonaga et al.

[11] Patent Number: 4,667,338

[45] Date of Patent: May 19, 1987

[54] NOISE ELIMINATION CIRCUIT FOR ELIMINATING NOISE SIGNALS FROM BINARY DATA

[75] Inventors: Kenji Toyonaga, Gifu; Yoshihito Higashitsutsumi; Akihiro Yanai, both of Anpachi; Toru Akiyama, Gifu, all of Japan

[73] Assignee: Sanyo Electric Co., Ltd., Osaka, Japan

[21] Appl. No.: 739,781

[22] Filed: May 31, 1985

[30] Foreign Application Priority Data

Jun. 1, 1984 [JP] Japan ................ 59-82253[U]
Jun. 4, 1984 [JP] Japan ................ 59-83325[U]

[51] Int. Cl.$^4$ ........................................... H03K 23/00
[52] U.S. Cl. ..................................... 377/45; 328/162; 307/449; 377/54
[58] Field of Search ............... 377/45, 54, 115; 307/449, 290, 272 R, 272 A; 328/165, 162

[56] References Cited

U.S. PATENT DOCUMENTS 3,894,185 7/1975 Vieri .......................... 377/45
3,912,121 10/1975 Steffen ....................... 377/45
4,060,242 11/1977 Huang et al. ................ 377/45
4,278,842 7/1981 Simmons ..................... 328/165

FOREIGN PATENT DOCUMENTS 53-118302 10/1978 Japan .

Primary Examiner—Stanley D. Miller
Assistant Examiner—K. Ohralik
Attorney, Agent, or Firm—Armstrong, Nikaido, Marmelstein & Kubovcik

[57] ABSTRACT

A noise elimination circuit for eliminating noise signals from data given by a binary form includes a modulo in up/down counter having a first input for receiving binary data, a second input for receiving clock pulses and output for producing a counted signal. The counter is effected to count up in response to the clock pulses when the binary data is a HIGH, and to count down in response to said clock pulses when the binary data is a LOW. A decoder is provided which has inputs for receiving the counted signal, a first output for producing an indication signal when the counted signal corresponds to a first predetermined number i, and a second output for producing an indication signal when the counted signal corresponds to a second predetermined number j, in which i is equal to or greater than zero, j is greater than i and n is equal to or greater than j. A flip-flop is provided which has a reset terminal connected to the first output of the decoder, a set terminal connected to the second output of the decoder and an output for producing a data with noise signals being eliminated.

3 Claims, 8 Drawing Figures

NOISE ELIMINATION CIRCUIT FOR ELIMINATING NOISE SIGNALS FROM BINARY DATA

BACKGROUND OF THE INVENTION

1. Field of the Invention

The present invention relates to a noise elimination circuit for eliminating noise signals contained in a pulse signal.

2. Description of the Prior Art

Recently, many developments have been made to a protocol controller, which controls a short distance data transmission, such as in a local network, at a high speed and high reliability between stations. The protocol controller also controls the rules assigned to the stations.

The data transmission system employing the protocol controller utilizes dedicated transmission lines, such as defined by coaxial cables, twist pair lines or optical fibers. Also, the system requires high quality hardware which eliminates noise signals as much as possible so as to improve the high reliability of the data.

For the noise elimination, a noise signal detection and elimination system has been proposed in Japanese Patent Application No. 236580/1983, which is assigned to the same assignee as this case. According to this Japanese Patent Application, 5-bit shift register 1 and decoder 2 defining a 5-bit majority decision circuit, such as shown in FIG. 1, are provided. The operation of the noise signal detection and elimination system of FIG. 1 is as follows.

The 5-bit shift register has an input for receiving data and an input for receiving clock pulses, and five outputs for producing the binary signal carried in each cell. Assuming that a data, such as shown in FIG. 4 waveform (a) is applied to data input and clock pulses, shown in FIG. 4 waveform (b) is applied to clock input. As depicted in waveform (a), data has a noise signal I during its HIGH period and noise signal II during its LOW period. When the first clock pulse is applied, a HIGH is deposited in the first cell of the 5-bit shift register, in response to the step up of the first clock pulse. Thus, five outputs from the 5-bit shift register produces (10000). In this case, majority decision circuit 2 has one 1 and four 0s. The majority is 0 and, thus, circuit 2 generates "0". The output of the majority decision circuit 2 is shown in FIG. 4, waveform (e).

When the second clock pulse is applied, the HIGH in the first cell is shifted to the second cell and a newly obtained HIGH is deposited in the first cell. Thus, 5-bit shift register produces (11000). Since the majority is still "0", circuit 2 generates "0".

When the third clock pulse is applied, the HIGHs in the first and second cells are shifted, respectively, to second and third cells, and a newly obtained HIGH is deposited in the first cell. Thus, 5-bit shift register produces (11100). Now the majority is "1", circuit 2 generates "1". Thereafter, during the HIGH period of the data, majority decision circuit 2 produces a HIGH.

When the noise signal I is received, the output of 5-bit shift register changes from (11111) to (01111) in response to the first clock pulse produced during the period of noise signal I. In this manner, the output of 5-bit shift register changes (01111) to (00111) and further to (00011). If the noise signal I has duration equal to or longer than a 3-clock pulse period, as in the case shown in FIG. 4, majority decision circuit 2 will produce a noise signal for at least one pulse period, as indicated in waveform (e).

Similarly, a noise signal II received during the LOW period of the data will also be produced from majority decision circuit 2.

In order to remove a noise signal having a relatively long duration, it may be accomplished by providing a shift register having a greater number of cell. However, such a shift register results in a high manufacturing cost. Also, even with a greater shift register, a problem described below can not be removed.

When short noise signals appear intermittently, such as noise signals II and III, the majority will change even by one short noise signal. Therefore, when such a short noise signal appears and disappears, the output of majority decision circuit 2 will change between "0" and "1". Thus, the elimination of the noise signals may not be done properly.

SUMMARY OF THE INVENTION

The present invention has been developed with a view to substantially solving the above described disadvantages and has for its essential object to provide an improved noise elimination circuit which can eliminate noise signals having a relatively long duration.

It is also an essential object of the present invention to provide a noise elimination circuit of the above described type which can eliminate noise signals each has a short duration and appears intermittently.

It is a further object of the present invention to provide an image position detecting device which is compact in size and can readily be manufactured at low cost.

In accomplishing these and other objects, according to the present invention, a noise elimination circuit for eliminating noise signals from data given by a binary form comprises a modulo n up/down counter having a first input for receiving binary data, a second input for receiving clock pulses and output for producing a counted signal. The counter is effected to count up in response to the clock pulses when the binary data is a HIGH, and to count down in response to the clock pulses when the binary data is a LOW. A decoder is provided which has inputs for receiving the counted signal, a first output for producing an indication signal when the counted signal corresponds to a first predetermined number i, and a second output for producing an indication signal when the counted signal corresponds to a second predetermined number j, in which i is equal to or greater than zero, j is greater than i and n is equal to or greater than j. A flip-flop is provided which has a reset terminal connected to the first output of the decoder, a set terminal connected to the second output of the decoder and an output for producing a data with noise signals being eliminated.

BRIEF DESCRIPTION OF THE DRAWINGS

These and other objects and features of the present invention will become apparent from the following description taken in conjunction with preferred embodiments thereof with reference to the accompanying drawings, throughout which like parts are designated by like reference numerals, and in which.

DESCRIPTION OF THE PREFERRED EMBODIMENTS

Figure 1:
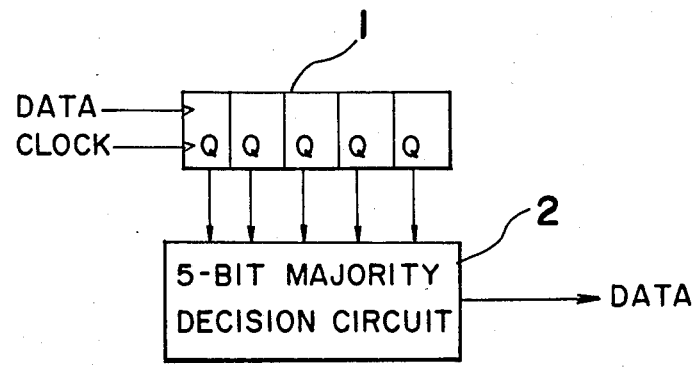
FIG. 1 is a circuit diagram of a noise elimination circuit according to the prior art.
Figure 2:
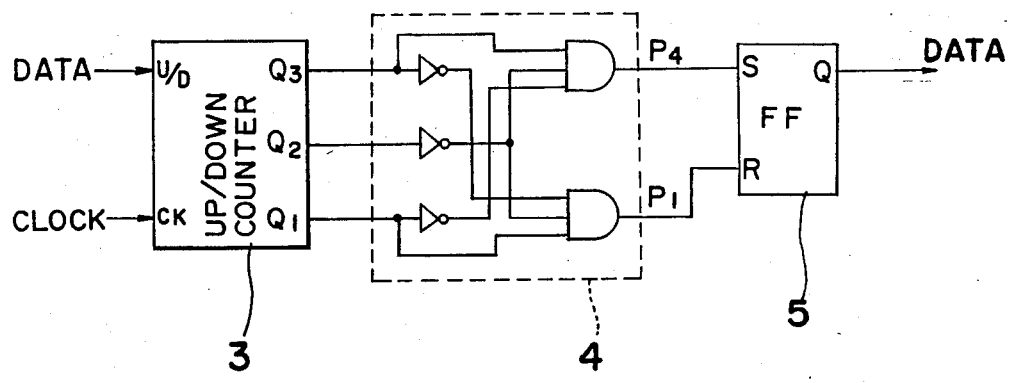
FIG. 2 is a circuit diagram of a noise elimination circuit according to a first embodiment of the present invention.
Figure 4:
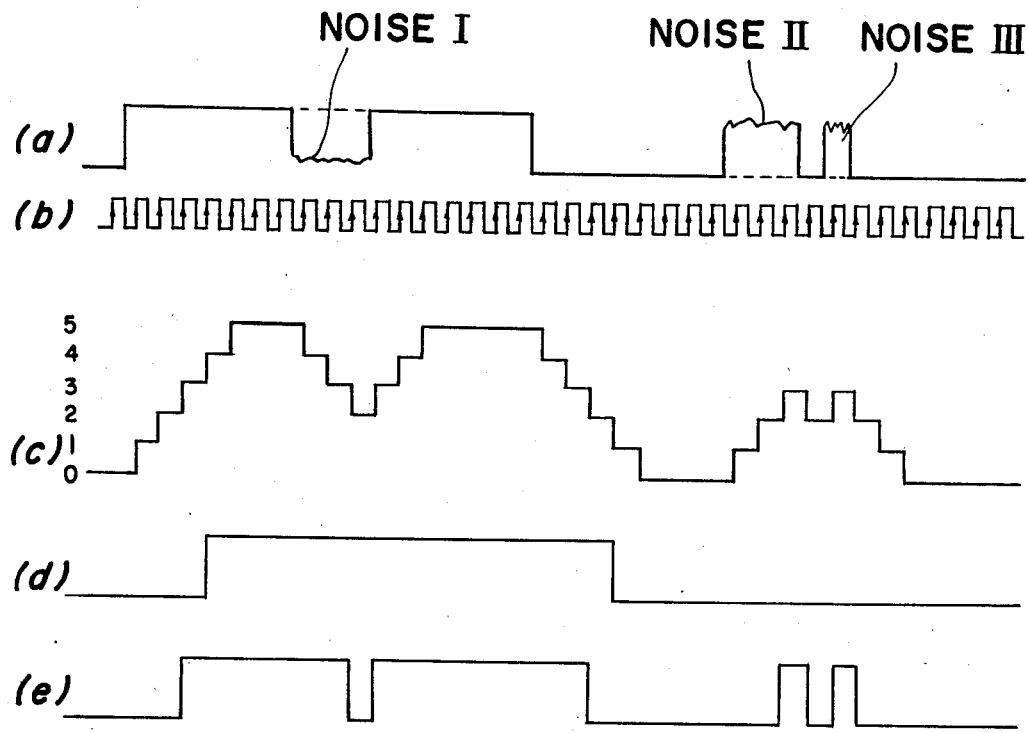
FIG. 4 is a graph showing waveforms of signals appearing at various places in the circuits of FIGS. 1 and 2.

Referring to FIG. 2, a noise elimination circuit according to a first embodiment of the present invention comprises a modulo 6 up/down counter 3 which is designed to count from 0 to 5. Up/down counter 3 has two inputs: U/D input for receiving data, such as shown in FIG. 4, waveform (a); and CL input for receiving clock pulses, such as shown in waveform (b). Up/down counter further has three outputs Q3, Q2 and Q1 for producing a signal representing the counted result. When the data applied to U/D input is HIGH, counter 3 counts up in response to the step up of the clock pulse. When the data applied to U/D input is LOW, counter 3 counts down in response to the step up of the clock pulse. When up/down counter is reset, Q3, Q2 and Q1 produce (0,0,0). When one pulse is counted Q3, Q2 and Q1 produce (0,0,1). In this manner, Q3, Q2 and Q1 produce a binary decimal coded signal representing the number of counted pulses. When counter 3 has counted up to five, Q3, Q2 and Q1 produce (1,0,1). Thereafter, regardless of a further clock pulses, no count up is effected.

Outputs Q3, Q2, and Q1 of up/down counter 3 are connected to a decoder 4 having inverters and AND gates. Decoder 4 has two outputs P1 and P4. When counter 3 has counted up or down to one, that is when Q3, Q2 and Q1 produce (0,0,1), output P1 produces HIGH. As to the other counted numbers, output P1 produces LOW.

Likewise, when counter 3 has counted up or down to four, that is when Q3, Q2 and Q1 produce (1,0,0), output P4 produces HIGH. As to the other counted numbers, output P4 produces LOW.

A flip-flop 5 is provided having set terminal S, reset terminal R and output Q. Output P1 of decoder 4 is connected to reset terminal R and output P4 is connected to set terminal S.

According to the noise elimination circuit described above, binary data, which may carry noise signals, such as shown in FIG. 4, waveform (a), is applied to U/D input of counter 3, and noiseless binary data, such as shown in FIG. 4, waveform (d), is produced from output Q of flip-flop 5. This operation will be described below.

Figure 3:
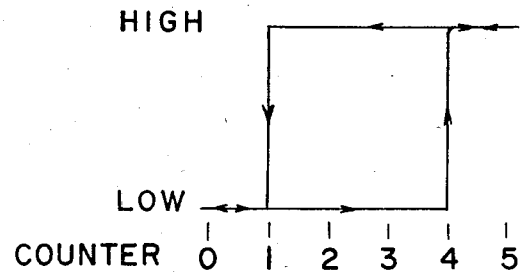
FIG. 3 is a diagram showing an operation of the noise elimination circuit of FIG. 2.

Referring to FIG. 3, a basic operation of the noise elimination circuit according to a first embodiment of the present invention is shown. Initially, outputs Q3, Q2 and Q1 produce (0,0,0), and therefore, P4 and P1 are now producing LOW. Also, flip-flop 5 is in the reset condition producing LOW from its output Q.

During the count up from zero and when counter 3 has counted up to one, output P1 produces HIGH, but has no affect in flip-flop 5, because it is already in the reset condition. When counter 3 has counted up to four, output P4 produces a HIGH, thereby setting flip-flop 5. Thus, the output Q produces a HIGH. The HIGH from the output Q is maintained during the further count up operation.

During the count down from five and when counter 3 has counted down to four, output P4 produces HIGH, but has no effect in flip-flop 5, because it is already in the set condition. When counter 3 has counted down to one, output P1 produces a HIGH, thereby resetting flip-flop 5. Thus, the output Q produces a LOW. The LOW from the output Q is maintained during the further count down operation. The characteristics as indicated in FIG. 3 is called a hysteresis characteristics. Also, the noise elimination circuit shown in FIG. 2 which has the hysteresis characteristics of FIG. 3 is referred to as a 5-bit 4:1 hysteresis type noise elimination circuit.

Referring now to FIG. 4, it is assumed that the data having a waveform (a) is applied to U/D input of counter 3. Before the noise signal I appears, counter 3 counts up from zero to five, as indicated by waveform (c). During the count up, and when the counter has counted up to four, flip-flop 5 is set, thereby producing a HIGH from the Q output of flip-flop 5, as indicated by waveform (d). Then, when the noise signal I is applied, counter 3 starts to count down. In this case, since the noise signal I has a duration equal to three clock pulses, counter 3 count down to two. However, as apparent from FIG. 3, the output Q is maintained HIGH during such a count down. Then, when the noise signal I is gone, counter 3 starts to count up again. Thus, the noise signal I is eliminated in the output signal from Q terminal.

Next, before the noise signal II appears, counter 3 is counted down to zero. Then, when the noise signal II is applied, counter 3 starts to count up. In this case, since the noise signal II has a duration equal to three clock pulses, counter 3 will count up to three. However, the terminal Q is still maintained to LOW. When the noise signal II is gone, counter 3 will count down to two. Then, even if the counter 3 is counted up again by the next noise signal III, the terminal Q continues to produce the LOW. Accordingly, the noise signals II and III will not be transmitted to the terminal Q.

Figure 5:
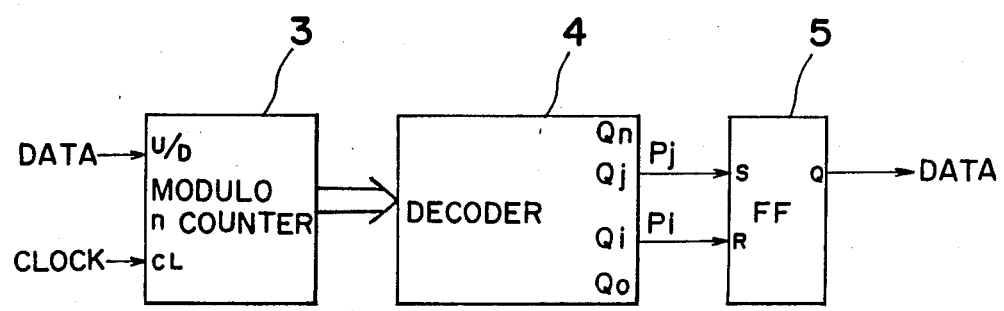
FIG. 5 is a circuit diagram showing a general form of the first embodiment of the present invention.

Referring to FIG. 5, a general form of the noise elimination circuit according to the first embodiment is shown. Up/down counter 3, which has been described as modulo 6, can be a modulo n, in which n is any number. Furthermore, the two outputs of decoder 4 can be indicated as Pj and Pi, wherein j and i are such that:

$$n \geq j > i \geq 0$$

and, preferably, $$n \geq j > n/2 > i \geq 0.$$

According to the first embodiment described above, noise signals having a relatively long duration can be eliminated without employing a counter for counting a large number. Therefore, the noise elimination circuit can be arranged in a compact size.

Figure 7:
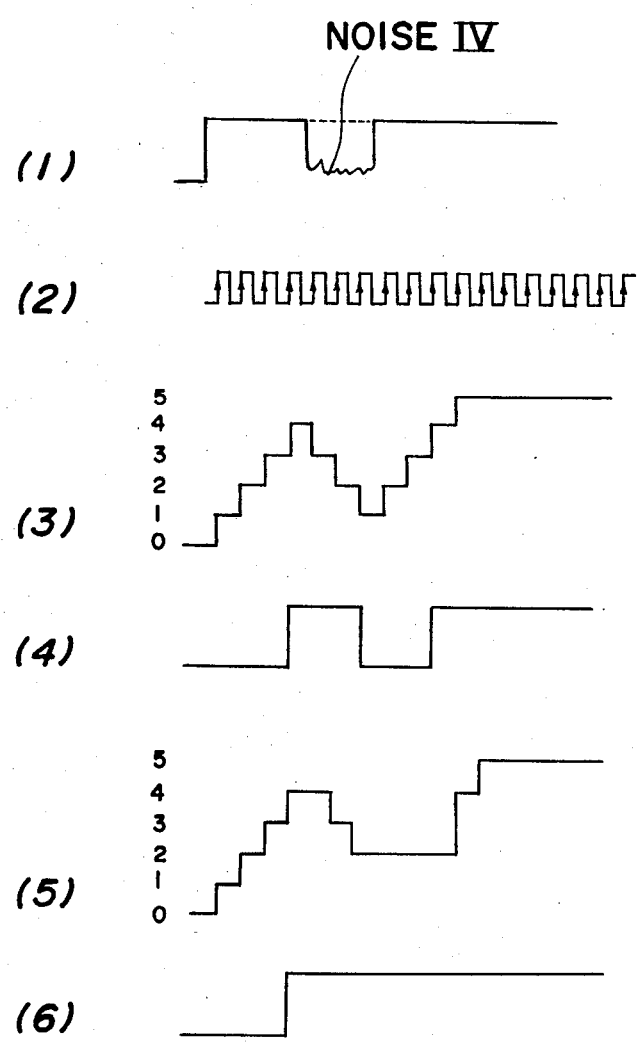
FIG. 7 is a graph showing waveforms of signals appearing at various places in the circuit of FIGS. 2 and 6.

According to the first embodiment, a problem still exists when eliminating a noise signal, such as noise signal IV shown in FIG. 7, that appears before counter 3 has counted to its maximum, i.e., five. According to the first embodiment, if the noise signal IV having a duration equal to three clock pulses appears when counter 3 has counted to four, counter 3 counts down to one, as indicated in FIG. 7, waveform (3), thereby producing a LOW from Q terminal of flip-flop 5 (waveform (4)). This LOW corresponds to the noise signal IV and can not be eliminated by the noise elimination circuit of the first embodiment.

Figure 6:
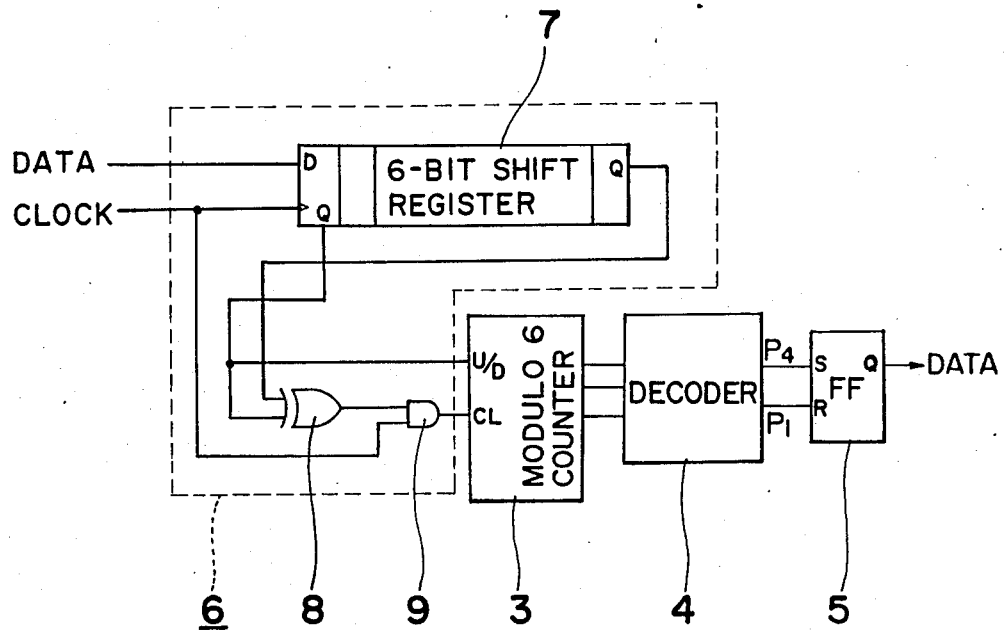
FIG. 6 is a circuit diagram of a noise elimination circuit according to a second embodiment of the present invention.

Referring to FIG. 6, a noise elimination circuit according to a second embodiment is shown. In addition to circuits 3, 4 and 5, the second embodiment further has a data change detector 6 provided in the front stage of counter 3. Data change detector 6 is defined by a 6-bit shift register 7, an EXCLUSIVE OR gate 8 and And gate 9. The first cell of 6-bit shift register 7 is connected to one input of EXCLUSIVE OR gate 8 and also to U/D input of counter 3. The last cell of 6-bit shift register 7 is connected to the other input of EXCLUSIVE OR gate 8. One input of AND gate 9 is connected to the output of EXCLUSIVE OR gate 8 and the other input thereof is so connected as to receive clock pulses.

Next, the operation of the second embodiment will be described. Initially, it is assumed that the shift register is carrying "0" in every one of its cells and the contents of counter 3 is zero. Also, flip-flop 5 is in the reset condition. It is also assumed that a data shown in FIG. 7 waveform (1) is now applied. When data HIGH is applied, it is stored in the first cell of the shift register. Thus, EXCLUSIVE OR gate 8 receives HIGH and LOW at the same time, thereby producing HIGH. Thus, AND gate 9 is enabled to transmit the clock pulses to CL input. At the same time, U/D input receives HIGH from the first cell of the shift register 7. Accordingly, count up is carried out in counter 3. In this manner, before the noise signal IV is applied, counter 3 counts up to four (waveform (5)) in response to four clock pulses. When counter 3 counts up to four, HIGH is produced from Q output of flip-flop 5 (waveform (6)). At this time, the six cells in shift register 7 carry data (1,1,1,1,0,0).

Then, in response to the first clock pulse after receiving the noise signal IV, the first cell of shift register 7 carries "0" and the last cell produces "0". Therefore, EXCLUSIVE OR gate 8 produces a LOW, thereby disabling AND gate 9. Thus, no count down is effected by the first clock pulse.

Then, in response to the second clock pulse after receiving the noise signal IV, the first cell of shift register 7 carries "0" and the last cell produces "1". Therefore, EXCLUSIVE OR gate 8 produces a HIGH, thereby enabling AND gate 9. Thus, count down is effected by the second clock pulse. Therefore, at this moment, the contents of the counter is three, and the six cells in shift register 7 carry data (0,0,1,1,1,1).

Then, in response to the third clock pulse after receiving the noise signal IV, the first cell of shift register 7 carries "0" and the last cell produces "1". Therefore, EXCLUSIVE OR gate 8 produces a HIGH, thereby enabling AND gate 9. Thus, count down is effected by the third clock pulse. Therefore, at this moment, the contents of the counter is two, and the six cells in shift register 7 carry data (0,0,0,1,1,1). Thereafter, proper data HIGH is applied to shift register 7.

Then, in response to the first clock pulse after receiving the proper data HIGH, the first cell of shift register 7 carries "1" and the last cell produces "1". Therefore, EXCLUSIVE OR gate 8 produces a LOW, thereby disabling AND gate 9. Thus, no count up is effected by the first clock pulse.

In this manner, no count up is effected by the next clock pulse and the pulse after the next clock pulse.

Then, in response to the fourth clock pulse after receiving the proper data HIGH, the first cell carries "1" and the last cell carries "0". Therefore, count up is effected by the fourth clock pulse.

Thus, in general, the detection circuit detects a change of number of binary 1s contained in a predetermined number of bits. The detection circuit is coupled to the up/down counter such that an up count is effected when the detection circuit detects that the number of binary 1s has increased and a down count is effected when the detection circuit detects that the number of binary 1s has decreased.

It is to be noted that the EXCLUSIVE OR gate may be connected to any two cells of the register.

Test for comparing the noise elimination circuit of the present invention with that of the prior art is carried out. In the tests, a constant LOW level signal which last for a predetermined number of bits, such as 1,000,000 bits is used as a proper data, and, as a noise signal, 10% HIGH level signal (100,000 bits) is imposed at random in said predetermined number of bits. A rate of HIGH level signal contained in the data produced from the noise elimination circuit represents the error rate. The test results based on the noise elimination circuit of the present invention are shown in Table 1 and those based the prior art circuit are shown in Table 2.

TABLE 1

| (Invention) | |
|---|---|
| Noise Elimination Circuit | Error Rate |
| 11-bit 7:4 Hysteresis | $6.0 \times 10^{-6}$ |
| 12-bit 7:5 Hysteresis | $1.9 \times 10^{-5}$ |
| 13-bit 8:5 Hysteresis | $3.0 \times 10^{-6}$ |
| 15-bit 9:6 Hysteresis | $2.0 \times 10^{-6}$ |

TABLE 2

| (Prior Art) | |
|---|---|
| Noise Elimination Circuit | Error Rate |
| 11-bit Majority Dec. CKT. | $2.3 \times 10^{-4}$ |
| 13-bit Majority Dec. CKT. | $5.3 \times 10^{-5}$ |
| 15-bit Majority Dec. CKT. | $1.6 \times 10^{-5}$ |

When the circuits having the same number of bits between the present invention and prior art are compared, the error rate of the present invention is improved.

Figure 8:
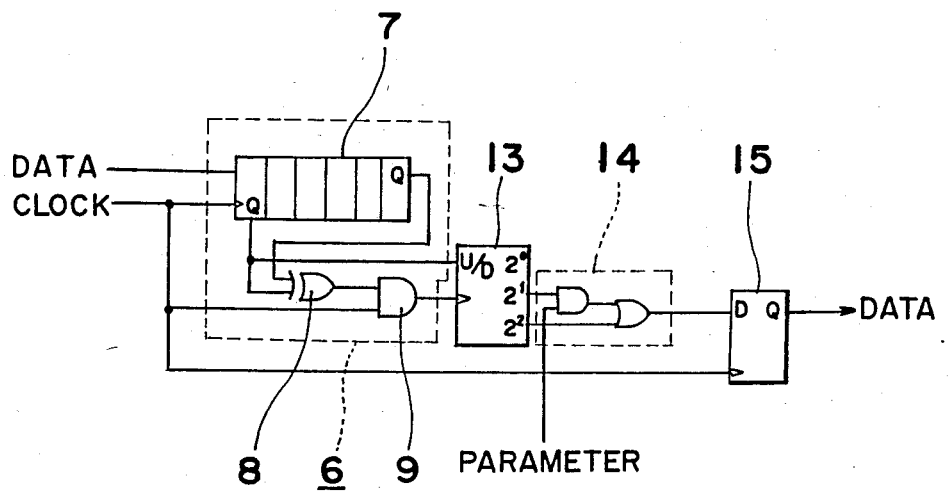
FIG. 8 is a circuit diagram of a noise elimination circuit according to a third embodiment of the present invention.

Referring to FIG. 8, a noise elimination circuit according to a third embodiment is shown, which comprises data change detector 6, 3-bit up/down counter 13, decoder 14 and D flip-flop 15. Decoder 14 is defined by AND gate and OR gate, and is connected with a parameter source. By the change of parameter, it is possible to change the threshold level of counter 13 from at which the decoding should be carried out. More specifically, by the change of threshold level of counter 13, the threshold level for changing the output of decoder may be either when counter 13 produces (1,0,0) or when it produces (1,1,0). Therefore, depending on the type of noise signal, it is possible to change the threshold of the decoder.

According to any of the embodiments described above, counter counts up or down in response to the step up of the clock pulse. This can be so changed that counter 3 counts up in response to the step up of each clock pulse and counts down in response to the step down of each clock pulse.

Although the present invention has been fully described with reference to several preferred embodiments, many modifications and variations thereof will now be apparent to those skilled in the art, and the scope of the present invention is therefore to be limited not by the details of the preferred embodiments described above, but only by the terms of the appended claims.

What is claimed is:

1. A noise elimination circuit for eliminating noise signals from data given by a binary form comprising:
   a modulo n up/down counter having a first input for receiving binary data, a second input for receiving clock pulses and output for producing a counted signal, said counter being effected to count up in response to said clock pulses when said binary data is in a first state, and to count down in response to said clock pulses when said binary data is in a second state;
   a decoder having inputs for receiving said counted signal, a first output for producing an indication signal when said counted signal corresponds to a first predetermined number i, and a second output for producing an indication signal when said counted signal corresponds to a second predetermined number j, said numbers having a relationship $n \geq j > i \geq 0;$ a flip-flop having a reset terminal connected to said first output of said decoder, a set terminal connected to said second output of said decoder and an output for producing a data with noise signals being eliminated; and
   a detection circuit for detecting a change of number of binary data in the one state contained in a predetermined number of bits, said detection circuit being coupled to said up/down counter such that an up count is effected when said detection circuit detects that the number of binary data in the one state has increased and a down count is effected when said detection circuit detects that the number of binary data in the one state has decreased.

2. A noise elimination circuit as claimed in claim 1, wherein said relationship is $n \geq j > n/2 > i \geq 0.$ 3. A noise elimination circuit as claimed in claim 1, wherein said detection circuit comprises an m-bit shift register having m cells, an EXCLUSIVE OR gate for receiving binary signals from any two cells of said register, an AND gate for gating said clock pulses.

* * * * *